US005686879A

United States Patent [19]
Schuhl et al.

[11] Patent Number: 5,686,879
[45] Date of Patent: Nov. 11, 1997

[54] AMMETER

[75] Inventors: Alain Schuhl, Palaiseau; Frédéric Nguyen Van Dau, Paris, both of France

[73] Assignee: Thomson-CSF, Paris, France

[21] Appl. No.: 641,033

[22] Filed: Apr. 30, 1996

[30] Foreign Application Priority Data

May 12, 1995 [FR] France ................... 95 05659

[51] Int. Cl.⁶ .................................... H01L 43/00
[52] U.S. Cl. .................................... 338/32 R
[58] Field of Search .................. 338/32 R, 32 H; 360/113; 324/252

[56] References Cited

U.S. PATENT DOCUMENTS

| 3,693,085 | 9/1972 | Beard | 324/117 H |
|---|---|---|---|
| 5,172,052 | 12/1992 | Wells | 324/117 R |
| 5,231,295 | 7/1993 | Tyc et al. | 257/38 |
| 5,239,187 | 8/1993 | Schuhl et al. | 338/32 R |
| 5,313,186 | 5/1994 | Schuhl et al. | 338/32 R |
| 5,378,683 | 1/1995 | Cabanel et al. | 505/190 |
| 5,474,833 | 12/1995 | Etienne et al. | 428/209 |

*Primary Examiner*—Aditya Krishnan
*Attorney, Agent, or Firm*—Oblon, Spivak, McClelland, Maier & Neustadt, P.C.

[57] ABSTRACT

This ammeter comprises an element made of magnetoresistive material in a thin layer located on a first face of a substrate; first connection means connected to the magnetoresistive element in two zones along a first direction (XX') and enabling the element to be supplied with current; second connection means connected to the magnetoresistive element in two zones located along a second direction (YY') perpendicular to the first direction (XX'). This ammeter enables the measurement of the value of the current flowing in a conductor preferably oriented in a direction (ZZ') parallel to the first direction (XX').

14 Claims, 4 Drawing Sheets

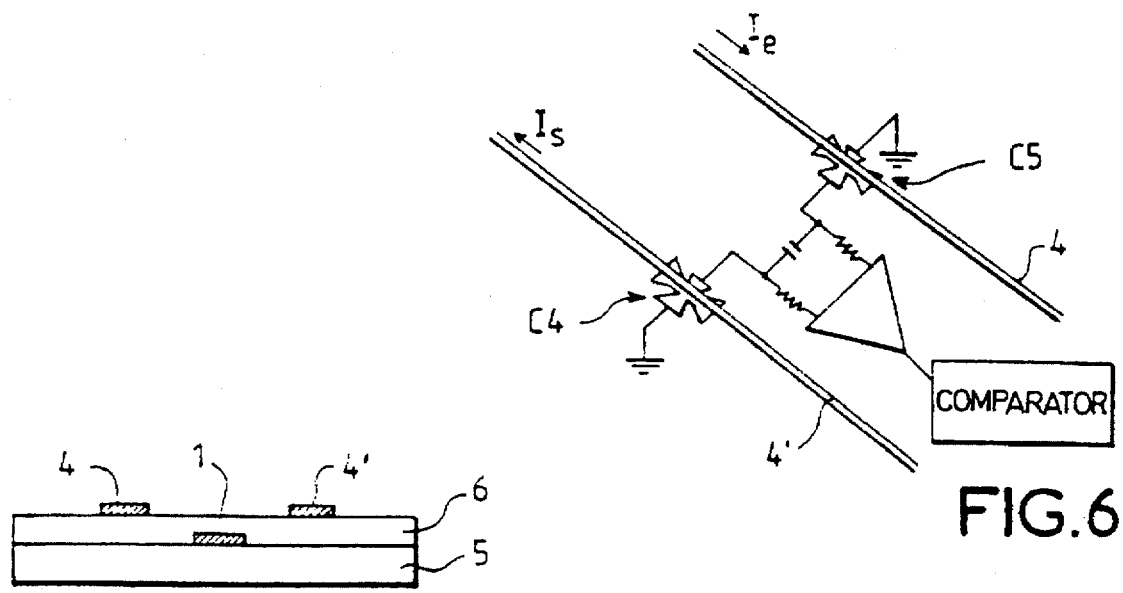
FIG. 6
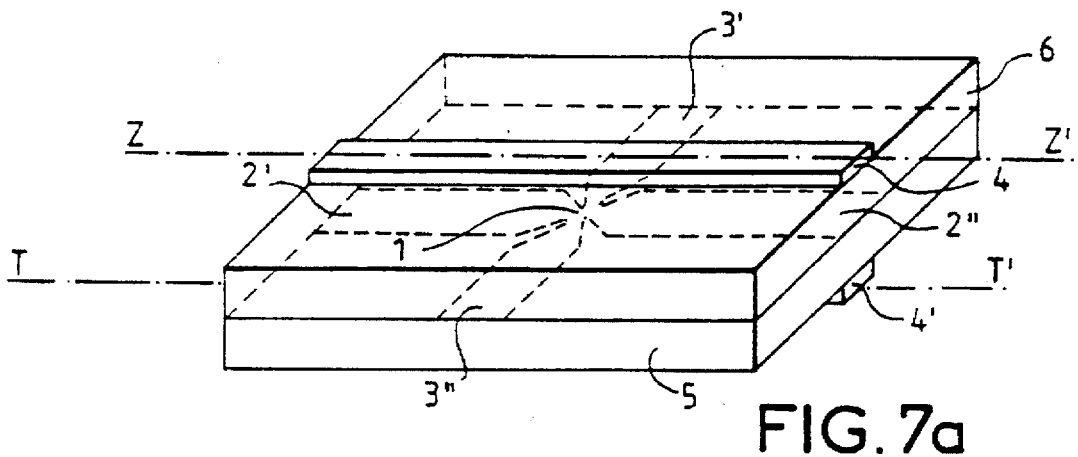
FIG. 7b
FIG. 7a
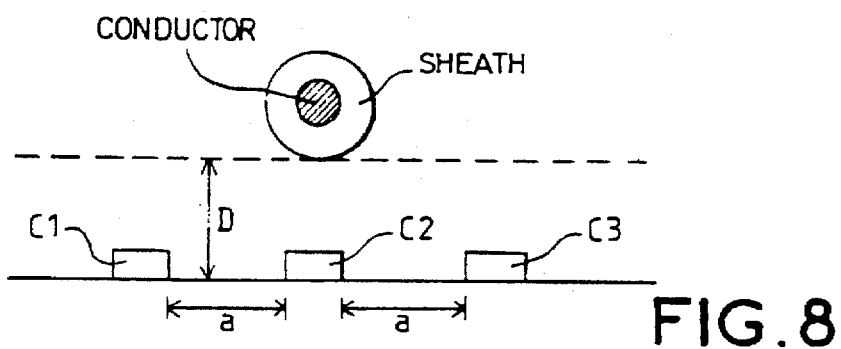
FIG. 8

AMMETER

BACKGROUND OF THE INVENTION

The invention relates to an ammeter and more particularly to an ammeter comprising a planar Hall effect magnetosensitive element. It can also be applied to a differential circuit breaker.

The French patent application No. 93 15551 describes a low magnetic field sensor based on a planar Hall effect magnetosensitive element.

A sensor of this kind relies on the transversal measurement of the anisotropic magnetoresistance effect in a ferromagnetic thin film. FIG. 1 shows the magnetosensitive layer. A current I flows in a direction XX' of the layer and the resistivity is measured in the direction YY'. This resistivity varies as a function of the magnetization M applied to the sensor. Furthermore, it is a function of the angle $\theta$ between the magnetization and the direction XX' of the current.

$$\rho = \frac{\Delta\rho}{2} \sin 2\theta$$

The two main advantages of planar Hall effect sensors as compared with longitudinal measurement magnetoresistive sensors are, firstly, a great simplification of the associated technology and secondly a reduction, by about four orders of magnitude, of the thermal drift which is the main component of noise at low frequency (around 1 Hz). By construction, this sensor can be made to be sensitive solely to the component of the magnetic field that is perpendicular to its direction of supply. Its size may be reduced to dimensions smaller than those of the magnetic domains. This enables the elimination of the noise source associated with the movements of walls. We have made measurements, on prototypes of sensors of this type, of an initial response over four orders of magnitude (see document by A. Schuhl, F. Nguyen-Van-Dau and J. R. Childress, in *Applied Physics Letters*, 66, 15th May 1995).

SUMMARY OF THE INVENTION

The invention therefore relates to an ammeter comprising:

an element made of magnetoresistive material in a thin layer located on a first face of a substrate;

first connection means connected to the magnetoresistive element in two zones located in a first direction (XX') and enabling a supply of current to the element;

second connection means connected to the magnetoresistive element in two zones located along a second direction (YY') perpendicular to the first direction (XX').

BRIEF DESCRIPTION OF THE DRAWINGS

The various objects and features of the invention shall appear more clearly in the following description and in the appended figures, of which:

FIG. 6 shows a differential ammeter circuit;

FIGS. 7a and 7b show a more compact differential ammeter applying the ammeter according to the invention;

FIG. 8 shows an ammeter with several sensors that do not require any device for positioning the conductor.

MORE DETAILED DESCRIPTION

Figure 1:
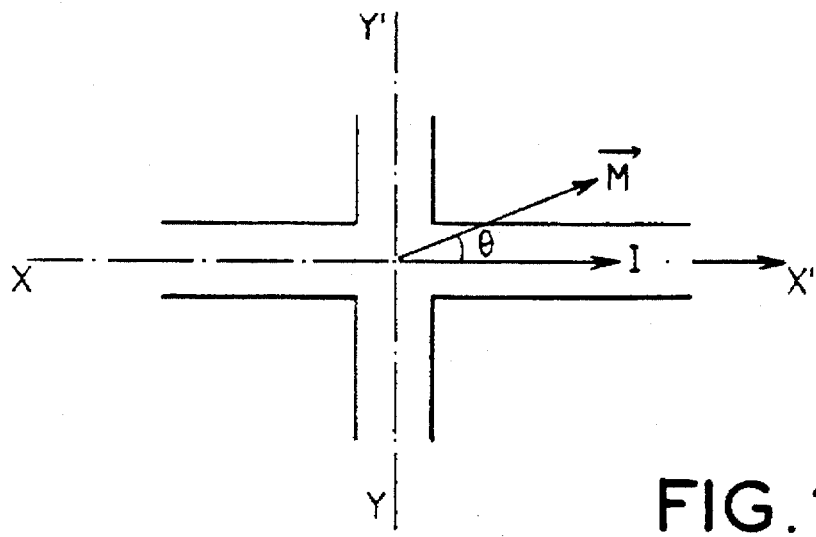
FIG. 1 shows a planar Hall effect device already described here above.
Figure 2:
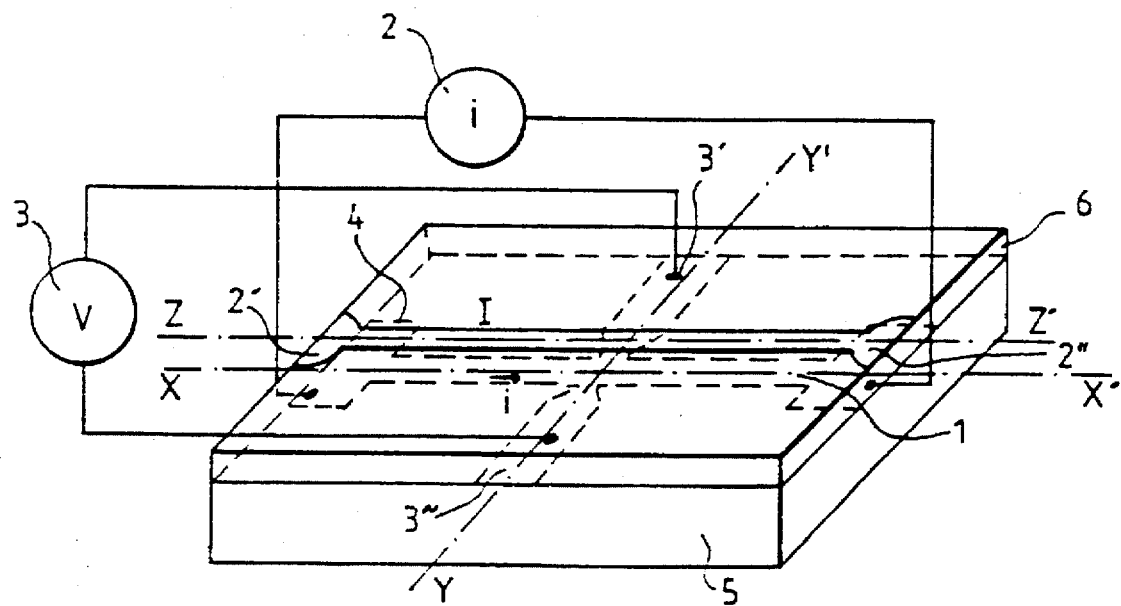
FIG. 2 shows an exemplary embodiment of a device according to the invention.

Referring to FIG. 2, a description shall therefore be given of an exemplary embodiment of an ammeter according to the invention.

A substrate 5 bears an element 1, which is preferably square-shaped but could be rectangular. This element is made in the form of a thin layer of a magnetoresistive material that can be used to obtain a planar Hall effect. Preferably, this material has an anisotropy oriented in the plane of the layer. For example, the thickness of the layer ranges from 0.01 µm to 1 µm (0.02 µm for example) and the width and the length of the element 1 range from 10 µm to 50 µm (20 µm for example). Along an axis XX', the element 1 has connection zones 2', 2" at its two ends, enabling the connection of a current supply machine 2 providing for the flow of a current i in the element 1. This current i is preferably a direct current and constant.

Two connection elements 3' and 3" are connected on each side of the element 1 along an axis YY' perpendicular to the axis XX'. These connection elements enable the connection of a voltage measurement or resistivity measurement machine 3. The connection zones 2', 2" and 3', 3" each have the width of one side of the element 1. Furthermore, it is provided that there will be a speedy increase of the width of these connection zones to reduce the limitations related to the Johnson noise as well as to electrical dissipation.

The element 1 is covered with an insulator 6.

On the insulator layer, there are provided means to enable the flow of a current I to be measured such as a conductor 4.

The flow of an electrical current in the conductor 4 (DC or AC) generates a transversal magnetic field (along the direction ZZ') that may be detected by the sensor. As shall be seen in the computation of the order of magnitude below, it is advantageous to be within the limit wherein the conductor is wider than the distance between the sensitive layer 1 and the sensor. The choice of the insulator between the conductor 4 and the layer 1 depends on the range of current to be measured. This insulator may be either a layer deposited on the layer 1 or a calibrated free space. The only constraint is that the wire should be parallel to the direction of supply of the sensor in such a way that the magnetic field associated with the flow of an electrical current in this conductor has at least one transversal component at the level of the sensor. In particular, it is not necessary for this conductor to be positioned right on the sensor as indicated in FIG. 2.

The computation of the amplitude of the magnetic field induced at the sensor by a measurement current with an amplitude I leads to the expression:

$$B = (\mu_0 I / \pi L) * \arctan (L/2D)$$

where:

L is the width of the conductor 4 conveying the current to be measured;

D is the distance between the conductor 4 and the layer 1. When $L/2D \gg 1$, we have $B \sim \mu_0 I / 2L$.

Thus, in the borderline case where $L \gg 2D$, the sensitivity of the ammeter is independent of the distance between the current line 4 and the sensitive element 1.

To make it possible to understand the value of the invention, two exemplary applications of the invention are given here below. These applications correspond to two distinct geometries with one and the same sensitive element detecting magnetic fields ranging from 10 nT to 1 mT.

By way of an example, two possible configurations are considered here below:

Geometry 1: L=300 µm and D=1 µm leading to B/I=2.1 mT/A=21 mG/mA

Geometry 2: L=1 cm and D=1 mm leading to B/I=3.15 $10^{-5}$ T/A=0.315 G/A.

A sensor made according to the geometry 1 will measure currents ranging from 5 µA to 500 mA. A sensor made according to the geometry 2 will measure currents ranging from 300 µA to 30 A. For a typical sensitivity of the sensor of 100 V/T.A and a supply of the layer 1 of the sensor with a current of 10 mA, the sensitivity obtained for the ammeter is 2.1 mV/A for the geometry 1 and 31.5 µV/A for the geometry 2.

Figure 3:
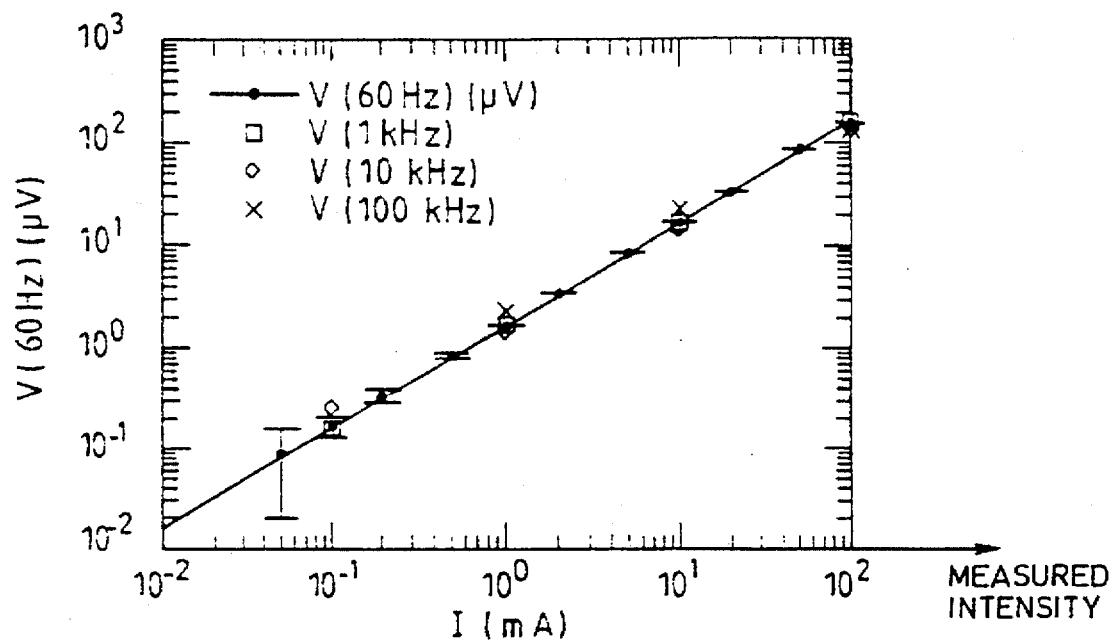
FIG. 3 shows a response curve of an ammeter according to the invention.

The curve of FIG. 3 shows an exemplary response of an ammeter according to the invention.

Figure 4:
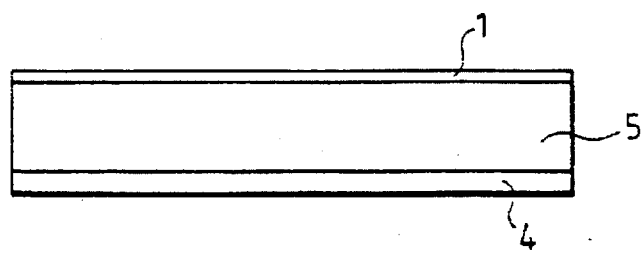
FIG. 4 shows a variant of the ammeter of FIG. 2.

FIG. 4 shows an alternative embodiment according to the invention in which the conductor 4 is located on the face of the substrate 5 opposite the one bearing the element 1. The substrate must then be an insulator substrate and its thickness determines the distance D between the element 1 and the conductor 4.

Figure 5A:
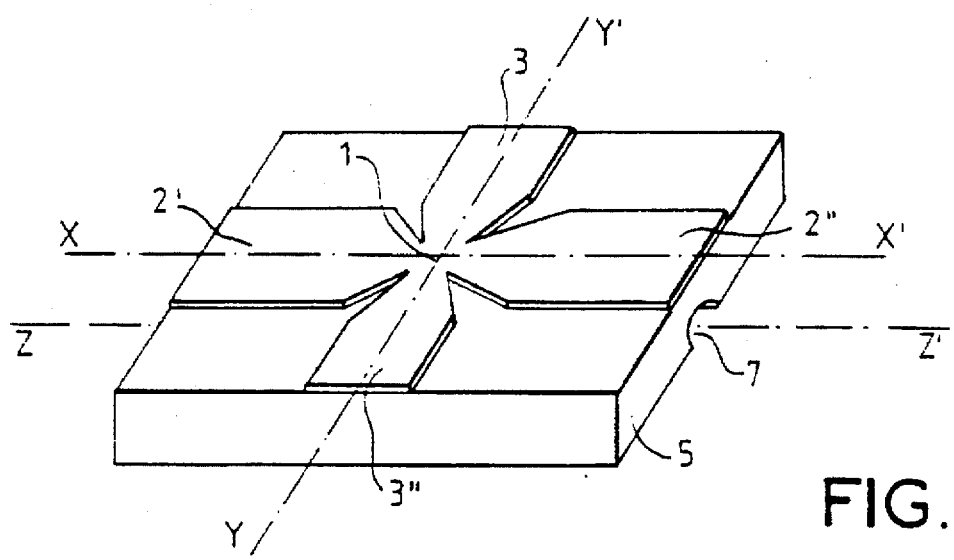
FIGS. 5a to 5c show means for the positioning of a conductor for which it is sought to measure the current.
Figure 5B:
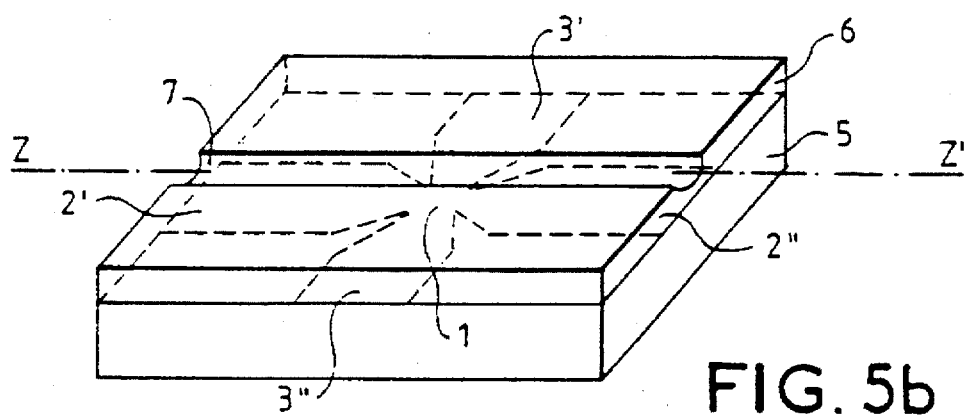

It is possible, using a planar Hall effect sensor thus described, to make a contact-free ammeter, namely a device that enables the measurement of the current flowing in an electric circuit element (for example a wire) without having to make connection with this element. For this purpose, as shown in FIGS. 5a and 5b, there is provision for a mechanical housing for the circuit element 4 enabling a controlled distance of the sensor. For example in FIG. 5a, on the rear face of the substrate opposite the element 1, means are provided enabling the positioning, along the axis ZZ', of a conductor in which there flows a current whose intensity I has to be measured. These positioning means may be reference marks drawn on the substrate. According to FIG. 5a, it is planned to have a groove 7 in which the conductor is placed. It could also have been planned to have bosses instead of the groove.

FIG. 5b is a variant of FIG. 5a according to which the groove 7 is placed in the insulator layer 6.

The problem associated with the lack of knowledge of the transversal dimension L of the circuit element 4 or with the possibility that this dimension may not be appreciably greater than the distance between the element and the sensor can be resolved by placing several sensors transversally to the flow of the current to be measured. The measurement made on each of the sensors and the knowledge of the distance between them can be used deduce the two unknown quantities, namely the lateral dimension of the circuit element and the intensity of the current.

This improvement enables a more precise measurement of the current in the case of a wire whose size (diameter of the wire+sheath) is of the same order of magnitude as the distance between the wire and the sensor.

FIG. 8 shows a particular example with three sensors C1, C2, C3 placed side by side on a substrate.

A device of this kind works as follows. All the sensors are moved until an identical response is obtained on C1 and on C3. The current I to be measured is then given by:

$$I = \frac{\pi B_2}{\mu_0} \frac{a}{\sqrt{\frac{B_2}{B_3} - 1}}$$

where "a" is the distance between the two sensors (C1–C2 and C2–C3) and B2 and B3 constitute the response of the sensors C2 and C3.

Figure 5C:
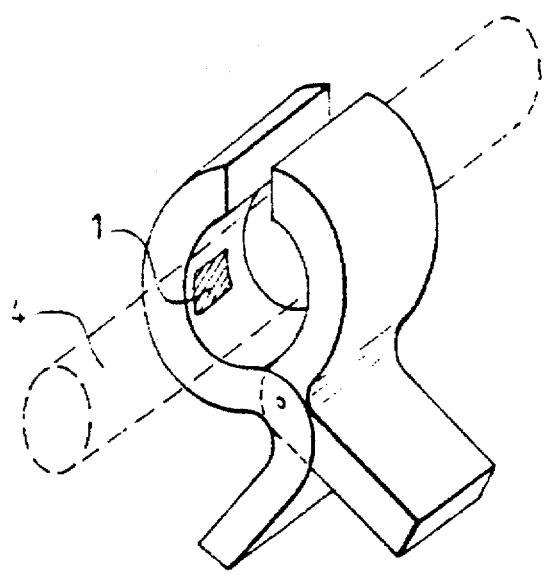

For reasons of convenience of use, the ammeter may be made in the form of a clamp 7 such as an ammeter clamp (FIG. 5c) enabling the conductor to be positioned before the sensitive element i of the ammeter which is then located in an arm of the clamp in the vicinity of the conductor 4.

In a more general and more elementary embodiment, it is also possible not to provide for any means for the positioning of the conductor for which the current is to be measured. The operation is then limited to placing the sensitive part of the ammeter (the element 1) in the vicinity of the conductor, and to making it rotate in such a way as to obtain a maximum value of the voltage (or of the resistivity). This maximum value gives the measurement value.

The invention also relates to the differential measurement of two currents flowing in two conductors.

FIG. 6 shows an ammeter that can be used to carry out a differential measurement, with the sensors C4 and C5, of the current in two conductors 4 and 4', in which there flow currents having values of intensity Ie and Is.

The values of intensity of the currents Ie and Is are measured separately, each by means of two sensors as described here above. The output signals of the sensors are then simplified as the case may be before they are compared.

The applications of this invention relate in particular to differential circuit breakers. The measurement of the difference in intensity between the lead-in line (Ie) and the outgoing line (Is) enables the detection of leakage and therefore makes it possible to cut off the input of current.

The invention can be applied equally well to direct current installations (in electronics and navigation) and/or alternating current installations.

FIG. 7a shows a way of making a differential ammeter and is derived from the embodiment of FIG. 2. On each side of the sensor, it has a conductor 4 and 4'. The conductor 4 is localized on the insulator layer 6 and the conductor 4' is localized on the face of the substrate 5 opposite the one bearing the sensitive element 1. The insulator layer 3 and the substrate 5 have the same thickness so that the conductors 4, 4' are at the same distance from the element 1. It is seen to it that the currents flowing in the conductors 4 and 4' have opposite directions and are in phase. If these conditions are met, and if the currents are equal, the magnetic field induced by the currents cancel each other out in the element 1. However, if they are not equal, the magnetic field of the stronger current predominates and a non-zero voltage is detected at the terminals 3–3'.

According to one variant shown in FIG. 7b, a differential ammeter can also be made by arranging for the conductors 4 and 4' to be on the same face of the sensor, for example on the insulator layer 6. The conductors 4 and 4' are then positioned so as to be at one and the same distance from the sensitive element 1 of the sensor.

What is claimed is:

1. An ammeter comprising:
   an element made of magnetoresistive material in a thin layer located on a first face of a substrate;
   first connection means connected to the magnetoresistive element in two zones along a first direction (XX') and enabling the element to be supplied with current;

second connection means connected to the magnetoresistive element in two zones located along a second direction (YY') perpendicular to the first direction (XX').

2. An ammeter according to claim 1, comprising first means to enable the flow of a first current (I) to be measured along a third direction (ZZ') substantially parallel to the first direction (XX') and in the vicinity of the magnetoresistive element.

3. An ammeter according to claim 2, wherein the means enabling the circulation of the current to be measured comprise a conductor provided with a connection means for the connection of an external circuit.

4. An ammeter according to claim 3, wherein the magnetoresistive layer is located on a first face of a substrate and wherein the conductor is located on a second face of the substrate opposite the first face.

5. An ammeter according to claim 3, wherein the magnetoresistive layer is covered with an insulator layer and wherein the conductor is located on this insulator layer.

6. An ammeter according to claim 1, comprising means to enable the positioning of a conductor in a third direction (ZZ') substantially parallel to the first direction (XX') and in the vicinity of the magnetoresistive layer.

7. An ammeter according to any of the claims 4, 5 or 6, wherein the second face of the substrate or of the insulator layer comprises means to secure the conductor in a position corresponding to the third direction (ZZ').

8. An ammeter according to claim 7, wherein the securing means comprise a groove.

9. An ammeter according to claim 7, comprising a clamp by which the conductor can be gripped between the arms of the clamp, one of the arms of the clamp comprising the element made of magnetoresistive material.

10. An ammeter according to claim 2, comprising second means to enable the circulation of a second current (I') along a fourth direction (TT') parallel to the third direction, these first means and these second means being at one and the same distance from the magnetoresistive element.

11. An ammeter according to claim 10, wherein the first and second means are located on each side of the magnetoresistive element.

12. An ammeter according to claim 2, comprising:
   another magnetoresistive element made of thin layers, also provided with connection means,
   means to enable the flow of a second current in another direction parallel to that of this other element and in the vicinity of this element;
   comparison means to compare the results of voltage measurements made on the connection means of the two magnetoresistive elements.

13. An ammeter according to claim 1, wherein the material of the magnetoresistive element possesses an anisotropy that maintains the direction of the magnetization of the material in a direction of a plane parallel to the first face of the substrate.

14. An ammeter according to claim 1, wherein the magnetoresistive element has a thickness of about 0.01 µm to 1 µm, for a width along the second direction (YY') of 10 to 50 µm, and wherein the width of the connection means along the first direction (XX') is about 10 µm to 50 µm.

* * * * *